United States Patent
Miyamoto et al.

(10) Patent No.: US 10,404,501 B2
(45) Date of Patent: Sep. 3, 2019

(54) WIRELESS COMMUNICATION SYSTEM AND COMMUNICATION METHOD

(71) Applicant: NIPPON TELEGRAPH AND TELEPHONE CORPORATION, Tokyo (JP)

(72) Inventors: Kenji Miyamoto, Yokosuka (JP); Jun Terada, Yokosuka (JP); Shigeru Kuwano, Yokosuka (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/085,057

(22) PCT Filed: Apr. 4, 2017

(86) PCT No.: PCT/JP2017/014071
§ 371 (c)(1),
(2) Date: Sep. 14, 2018

(87) PCT Pub. No.: WO2017/175754
PCT Pub. Date: Oct. 12, 2017

(65) Prior Publication Data
US 2019/0089562 A1    Mar. 21, 2019

(30) Foreign Application Priority Data
Apr. 6, 2016 (JP) .................................. 2016-076552

(51) Int. Cl.
*H03M 13/45* (2006.01)
*H04L 25/06* (2006.01)
(Continued)

(52) U.S. Cl.
CPC .......... *H04L 25/067* (2013.01); *H03M 13/45* (2013.01); *H04L 27/00* (2013.01); *H04L 27/233* (2013.01)

(58) Field of Classification Search
CPC ................... H04B 17/309; H04B 7/024; H04L 2025/0342; H04L 25/03292; H04L 25/067;
(Continued)

(56) References Cited

U.S. PATENT DOCUMENTS

2015/0358116 A1* 12/2015 Khayrallah ........... H04L 1/0054
375/341
2016/0013952 A1    1/2016 Nakamura et al.

FOREIGN PATENT DOCUMENTS

JP    2013-535912 A    9/2013
WO    WO-01/22598 A1    3/2001
(Continued)

OTHER PUBLICATIONS

Kenji Miyamoto et al., Proposal on Functional-Split Scheme of Base Stations for Future Radio Access, IEICE Technical Report, CS2015-15, pp. 33-38, Jul. 2015, with partial translation attached.
(Continued)

*Primary Examiner* — Rahel Guarino
(74) *Attorney, Agent, or Firm* — Harness, Dickey & Pierce, P.L.C.

(57) ABSTRACT

A wireless communication system includes an RF reception unit configured to receive a radio signal from a terminal; a channel estimation unit configured to estimate channel information of a wireless transmission path with respect to the terminal; a demodulation unit configured to perform soft decision demodulation on the radio signal; a quantization unit configured to quantize a log likelihood ratio obtained through soft decision demodulation in the demodulation
(Continued)

unit, on the basis of a statistical distribution determined using an average value of the log likelihood ratio determined in accordance with a modulation scheme used in wireless communication with the terminal and a variance of a log likelihood ratio obtained on the basis of the channel information; and a decoding unit configured to perform a decoding process on the log likelihood ratio quantized by the quantization unit.

5 Claims, 5 Drawing Sheets

(51) Int. Cl.
    *H04L 27/00*     (2006.01)
    *H04L 27/233*     (2006.01)

(58) Field of Classification Search
    CPC ............ H04L 25/03305; H04L 25/021; H04L 25/0222; H04L 27/233; H04L 25/03318; H04L 2025/03401; H04L 1/0047; H04L 25/0236; H04L 27/00; H04L 27/2647; H04L 27/38; H04L 25/03286; H04L 25/0202; H04W 84/045; H04W 88/04; H04W 88/10; H04W 88/06; H04W 88/085

See application file for complete search history.

(56) References Cited

FOREIGN PATENT DOCUMENTS

| | | |
|---|---|---|
| WO | WO-2012/012248 A1 | 1/2012 |
| WO | WO-2014/136578 A1 | 9/2014 |

OTHER PUBLICATIONS

Tomoaki Ohtsuki, Communication Technology: Basic Knowledge and Its Trend [III]: Error-Correction Coding, IEICE, vol. 90, No. 7, pp. 549-555, Jul. 2007, with partial translation attached.

C. Novak, et al., "Quantization for soft-output demodulators in bit-interleaved coded modulation systems", ISIT 2009, pp. 1070-1074, 2009.

International Search Report for PCT/JP2017/014071, ISA/JP, dated Jun. 20, 2017, with English translation attached.

\* cited by examiner

WIRELESS COMMUNICATION SYSTEM AND COMMUNICATION METHOD

CROSS-REFERENCE TO RELATED APPLICATIONS

This application is a 371 U.S. National Stage of International Application No. PCT/JP2017/014071, filed Apr. 4, 2017, which claims priority to Japanese Patent Application No. 2016-076552, filed Apr. 6, 2016. The entire disclosures of both of the above applications are incorporated herein by reference.

TECHNICAL FIELD

The present invention relates to a wireless communication system and a communication method.

BACKGROUND ART

Figure 5:
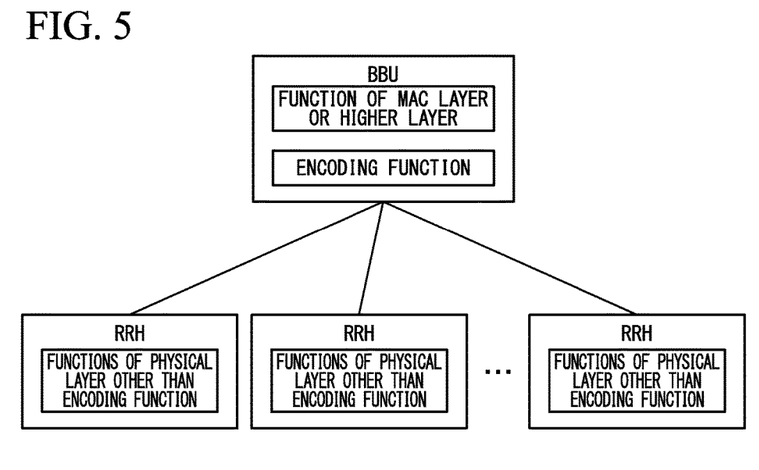
FIG. 5 is a diagram showing an example of a function division scheme of an SPP of the related art.

In a wireless communication system, particularly, in a mobile communication system, it has been studied to adapt a configuration in which functions of a base station are divided for two devices including a base band unit (BBU) and a remote radio head (RRH) and the BBU and the RRH are physically separated in order to increase flexibility of deployment of a base station. As one form of a function division scheme in the BBU and the RRH, a functional division scheme in which the BBU performs a function of a media access control (MAC) layer or a higher layer and an encoding function that is one function of a physical layer, and the RRH performs functions of the physical layer other than the encoding function as shown in FIG. 5 has been studied (Non-Patent Document 1). This function division scheme is called a split-PHY processing (SPP) scheme.

As a scheme of demodulating a radio signal received in a base station or a terminal, there is a soft decision demodulation scheme for outputting a signal bit obtained through demodulation as a ratio of a real number value called a likelihood indicating a probability of the signal bit being 0 or 1 instead of outputting the signal bit obtained through demodulation as a bit value of 0 or 1 (Non-Patent Document 2). In the soft decision demodulation scheme, the output is called a log likelihood ratio or LLR (Log Likelihood Ratio). In general, a greater positive value of the LLR indicates that a likelihood of the signal bit being 1 is higher, and a smaller negative value (with a greater absolute value) indicates that a likelihood of the signal bit being 0 is higher.

Figure 6:
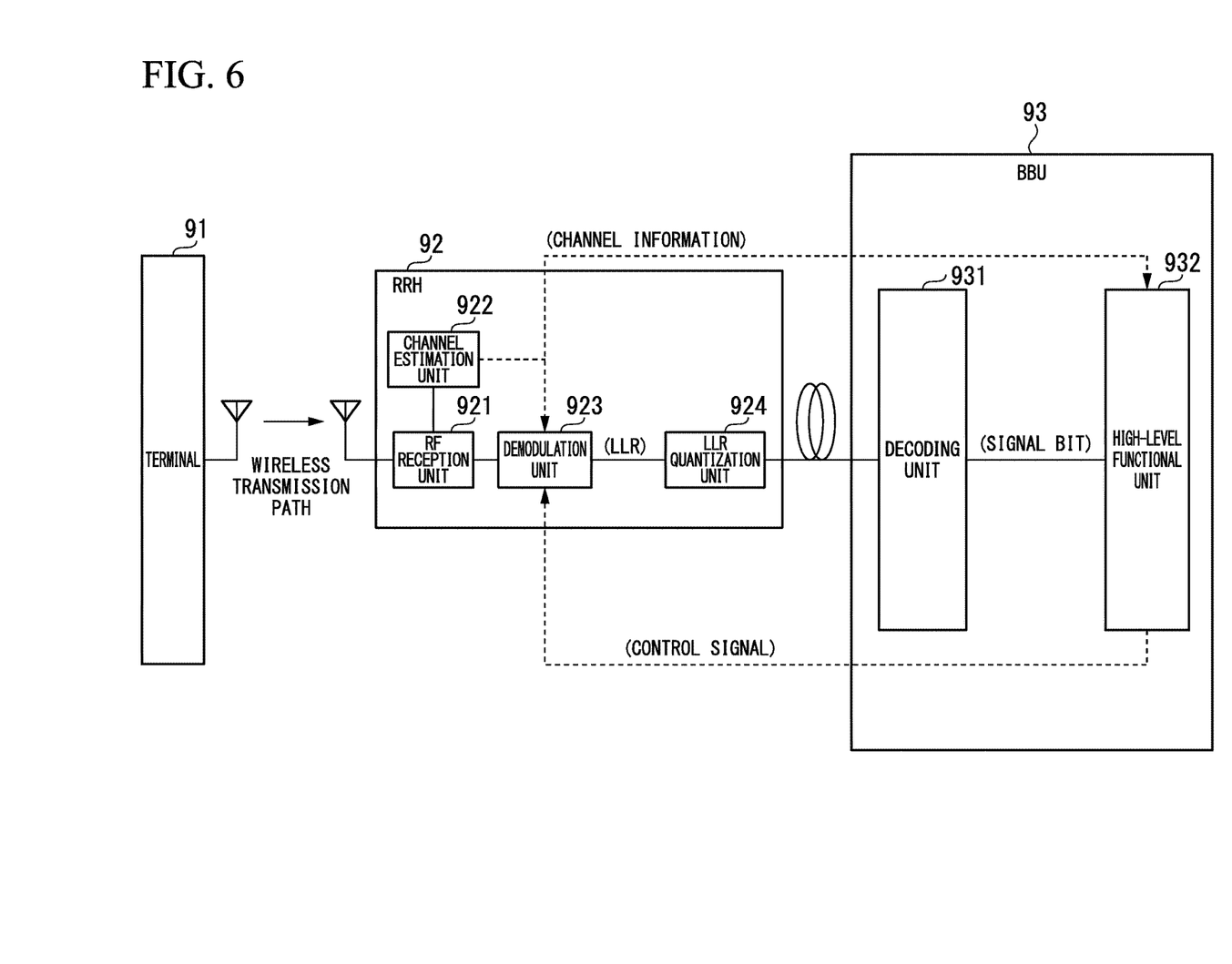
FIG. 6 is a diagram showing a configuration example of a wireless communication system to which the SPP scheme of the related art is applied.

FIG. 6 is a diagram showing a configuration example of a wireless communication system to which an SPP scheme is applied. The wireless communication system includes a terminal 91, an RRH 92, and a BBU 93. The RRH 92 includes a radio frequency (RF) reception unit 921, a channel estimation unit 922, a demodulation unit 923, and an LLR quantization unit 924. The BBU 93 includes a decoding unit 931 and a high-level functional unit 932.

The RRH 92 and the BBU 93 perform predetermined settings before starting a process of receiving a radio signal that is transmitted from the terminal 91. Specifically, the high-level functional unit 932 transmits a control signal to the demodulation unit 923. The demodulation unit 923 sets a demodulation parameter for performing demodulation according to a state of a wireless transmission path on the basis of the control signal. Examples of the demodulation parameter include a parameter indicating a modulation scheme that is used for demodulation such as quadrature phase shift keying (QPSK) or 16 quadrature amplitude modulation (QAM), and a parameter indicating a coding rate that is used for demodulation such as ⅓ or ¾.

The radio signal transmitted from the terminal 91 is received by the RF reception unit 921 via the wireless transmission path. The RF reception unit 921 outputs a reference signal included in the received radio signal to the channel estimation unit 922, and outputs a data signal included in the received radio signal to the demodulation unit 923. The reference signal is used for extracting channel information of the wireless transmission path and includes a predetermined signal between the terminal 10 and the RRH 20. The data signal is to be sent to the BBU 93 and includes a sequence of signal bits. The channel estimation unit 922 estimates the channel information of the wireless transmission path on the basis of the reference signal, outputs the channel information to the demodulation unit 923, and feeds back the channel information to the BBU 93.

The demodulation unit 923 performs soft decision demodulation on the data signal using the demodulation parameter indicated by the control signal and the channel information output from the channel estimation unit 922. The demodulation unit 923 outputs an LLR value obtained by soft decision demodulation to the LLR quantization unit 924. Since the LLR value output from the demodulation unit 923 to the LLR quantization unit 924 is a real number value, the LLR quantization unit 924 transmits a value obtained through quantization performed on the LLR value to the BBU 93.

The decoding unit 931 receives the quantized LLR value from the RRH 92 and performs a decoding process on the received LLR value to obtain a signal bit. The decoding unit 931 outputs the obtained signal bit to the high-level functional unit 932 as information transmitted from the terminal 91.

The smaller the number of quantization bits for the LLR value obtained in the RRH 92, the smaller the amount of transmission between the RRH 92 and the BBU 93. When the number of quantization bits is merely made small, a quantization error of the LLR value becomes large. Therefore, as an LLR quantization scheme, there is a scheme that collects samples of the LLR value, obtains a statistical distribution of the LLR value, and determines an optimal quantization threshold value and an optimal quantization level for the statistical distribution at a predetermined number of quantization bit (Non-Patent Document 3).

CITATION LIST

Non-Patent Literature

Non-Patent Document 1: Kenji Miyamoto et al., "Proposal of Functional-Split Scheme of Base Stations for Future Radio Access," IEICE Tech., Vol. 115, no. 123, CS 2015-15, pp. 33-38, July 2015

Non-Patent Document 2: Tomoaki Otsuki, "Communication Technology: Basic Knowledge and Its Trend [III]: Error-Correction Coding," Journal of the Institute of Electronics, Information and Communication Engineers, Vol. 90, No. 7, pp. 549-555, July 2007

Non-Patent Document 3: C. Novak, et al., "Quantization for Software-Output Demodulators in Bit-interleaved Coded Modulation Systems," ISIT 2009, pp. 1070-1074, 2009

SUMMARY OF INVENTION

Technical Problem

However, with the above-described scheme, there is a problem in that it is necessary to wait until sufficient samples of the LLR value are collected before starting quantization in order to determine the statistical distribution of the LLR value, and a processing delay in the wireless communication system increases.

In view of the above circumstances, an object of the present invention is to provide a wireless communication system and a communication method capable of reducing a processing delay in LLR quantization.

Solution to Problem

A wireless communication system according to a first aspect of the present invention includes an RF reception unit configured to receive a radio signal from a terminal; a channel estimation unit configured to estimate channel information of a wireless transmission path with respect to the terminal on the basis of the radio signal received by the RF reception unit; a demodulation unit configured to perform soft decision demodulation on the radio signal on the basis of the channel information estimated by the channel estimation unit; a quantization unit configured to quantize a log likelihood ratio obtained through soft decision demodulation in the demodulation unit, on the basis of a statistical distribution determined using an average value of the log likelihood ratio determined in accordance with a modulation scheme used in wireless communication with the terminal and a variance of a log likelihood ratio obtained on the basis of the channel information; and a decoding unit configured to perform a decoding process on the log likelihood ratio quantized by the quantization unit.

Further, according to a second aspect of the present invention, in the wireless communication system of the first aspect, the channel estimation unit is further configured to calculate the variance of the log likelihood ratio on the basis of the channel information, and output the calculated variance to the quantization unit.

Further, according to a third aspect of the present invention, the wireless communication system of the first aspect includes a high-level functional unit configured to calculate the variance of the log likelihood ratio on the basis of the channel information estimated by the channel estimation unit and transmits the variance to the quantization unit.

Further, according to a fourth aspect of the present invention, in the wireless communication system of any one of the first, second and third aspects, the quantization unit is further configured to determine a quantization threshold value and a quantization level on the basis of a Gaussian distribution having the variance and the average value of the log likelihood ratio determined in accordance with the modulation scheme used in the wireless communication with the terminal.

Further, a communication method in a fifth aspect of the present invention includes an RF reception step of receiving a radio signal from a terminal; a channel estimation step of estimating channel information of a wireless transmission path with respect to the terminal on the basis of the radio signal received in the RF reception step; a demodulation step of performing soft decision demodulation on the radio signal on the basis of the channel information estimated in the channel estimation step; a quantization step of quantizing a log likelihood ratio obtained in the demodulation step, on the basis of a statistical distribution determined using an average value of the log likelihood ratio determined in accordance with a modulation scheme used in wireless communication with the terminal and a variance of a log likelihood ratio obtained on the basis of the channel information; and a decoding step of performing a decoding process on the log likelihood ratio quantized in the quantization step.

Advantageous Effects of Invention

According to the present invention, it is possible to reduce a processing delay caused by LLR quantization.

DESCRIPTION OF EMBODIMENTS

Hereinafter, a wireless communication system and a communication method according to an embodiment of the present invention will be described with reference to the drawings. It should be noted that in the following embodiments, the same components denoted by the same reference numerals are assumed to perform the same operation, and duplicated description will be appropriately omitted.

In each of the embodiments that will be described below, a statistical distribution is determined from an average value of a log likelihood ratio (LLR) value determined in accordance with a modulation scheme and a variance that can be calculated from power of a noise signal included in a received signal, instead of collecting sufficient samples of the LLR value in order to determine the statistical distribution of the LLR value. The statistical distribution of the LLR value takes the form of a symmetrical Gaussian distribution (normal distribution) determined by the variance and the average value.

Figure 1:
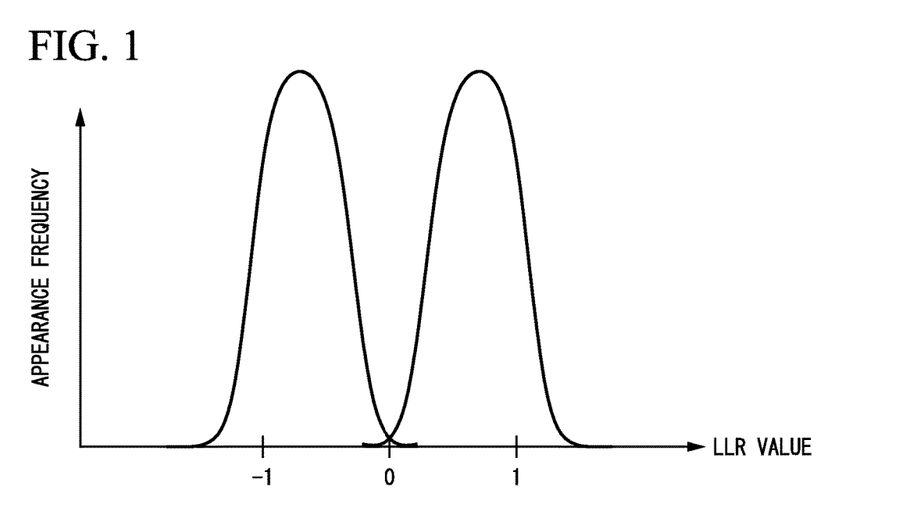
FIG. 1 is a diagram showing an example of a statistical distribution of an LLR value obtained from a signal modulated using BPSK that is a binary modulation scheme.

FIG. 1 is a diagram showing an example of a statistical distribution of the LLR value obtained from a signal modulated through binary phase shift keying (BPSK) which is a binary modulation scheme. In FIG. 1, a horizontal axis indicates the LLR value and a vertical axis indicates an appearance frequency of the LLR value. In BPSK, as shown in FIG. 1, two distributions including a Gaussian distribution indicating a likelihood of one modulated signal bit being 1 and a Gaussian distribution indicating a likelihood of the signal bit being 0 are obtained. The wireless communication system and the communication method of each embodiment utilize such characteristics that the statistical distribution of the LLR value takes the form of Gaussian distributions that are symmetrical with respect to a straight line with LLR value=0 as shown in FIG. 1. In the wireless communication system and the communication method, a processing delay caused by LLR quantization is reduced by acquiring the statistical distribution of the LLR value on the basis of the variance and characteristics of the LLR values.

First Embodiment

Figure 2:
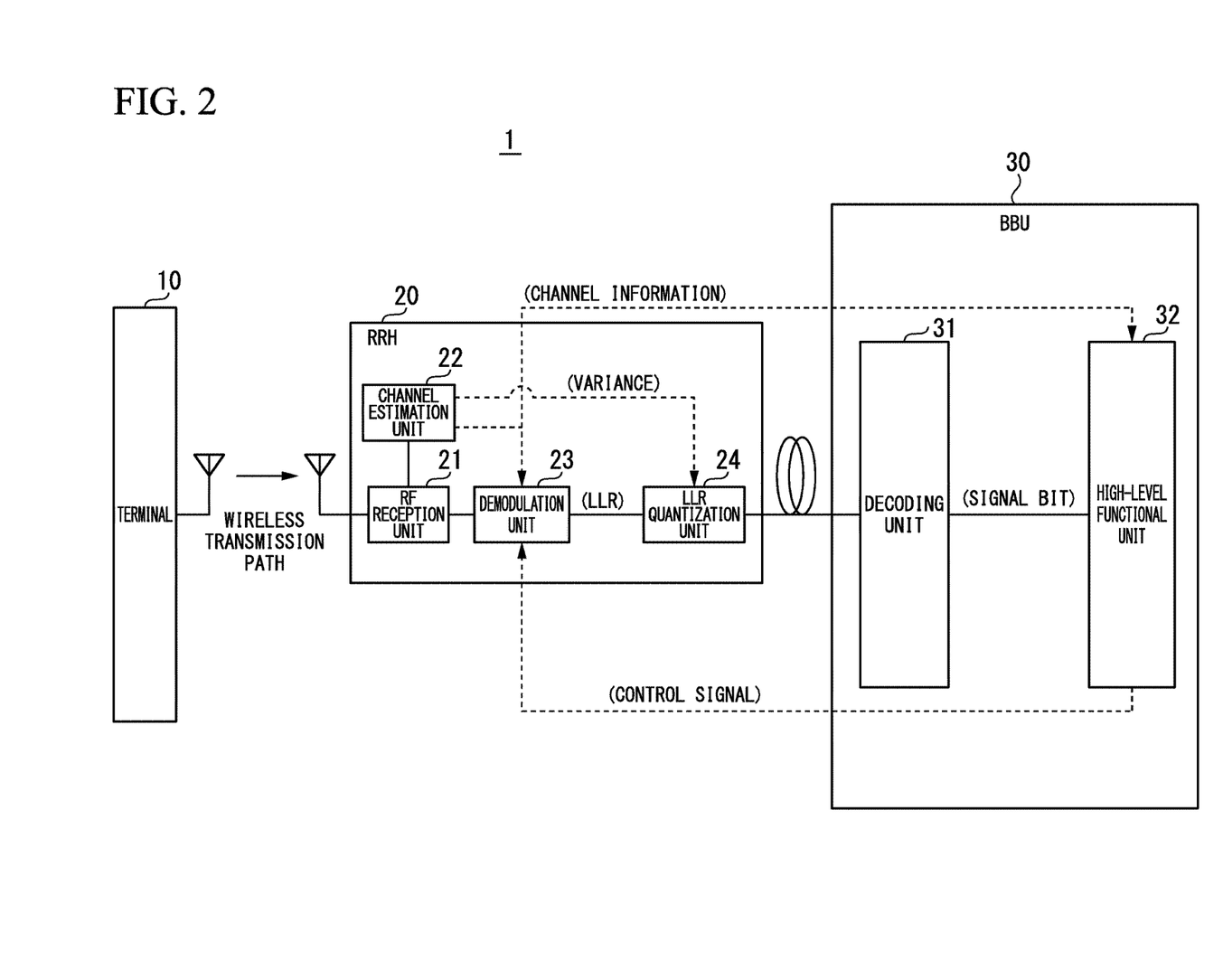
FIG. 2 is a block diagram showing a configuration example of a wireless communication system in a first embodiment.

FIG. 2 is a block diagram showing a configuration example of a wireless communication system 1 according to a first embodiment. The wireless communication system 1 includes a terminal 10, and an RRH 20 and a BBU 30 that function as base stations. The RRH 20 and the BBU 30 are connected to be able to communicate with each other by a wire (for example, an optical fiber or a coaxial cable). The RRH 20, as a wireless device, includes an RF reception unit 21, a channel estimation unit 22, a demodulation unit 23 and an LLR quantization unit 24. The BBU 30, as a signal processing device, includes a decoding unit 31 and a high-level functional unit 32.

The RRH 20 and the BBU 30 perform predetermined settings before starting a process of receiving a radio signal transmitted from the terminal 10. The settings are the same as the settings that are performed by the RRH 92 and the BBU 93 shown in FIG. 6.

The RF reception unit 21 receives the radio signal transmitted from the terminal 10 using an antenna. The RF reception unit 21 outputs the reference signal included in the received radio signal to the channel estimation unit 22 and outputs the data signal included in the received radio signal to the demodulation unit 23. The reference signal is used for extracting channel information of the wireless transmission path between the terminal 10 and the RRH 20. The data signal includes a sequence of signal bit strings to be sent to the BBU 30.

The channel estimation unit 22 compares a predetermined signal between the terminal 10 and the RRH 20 with the reference signal output from the RF reception unit 21 and estimates channel information indicating the amount of phase rotation and the amount of attenuation from which the radio signal suffers in the wireless transmission path. The channel estimation unit 22 outputs the channel information to the demodulation unit 23 and also transmits the channel information to the BBU 30. In addition, the channel estimation unit 22 extracts a noise signal included in the reference signal on the basis of the predetermined signal and the channel information. The channel estimation unit 22 calculates a variance of the LLR value in the case that soft decision demodulation is performed on the data signal, from power (noise power) of the extracted noise signal. The channel estimation unit 22 outputs the calculated variance to the LLR quantization unit 24.

A scheme of calculating the variance of the LLR value from the noise power is a scheme of directly using the noise power value as the variance, a scheme of using a difference between a noise power value and a reference value as the variance, or a scheme of using a value obtained by normalizing a noise power value as the variance. Further, as another scheme, for example, a variance of each noise power value at which a clear difference appears in wireless transmission characteristics is measured in advance and a table in which the variance can be obtained from the noise power value, which is created on the basis of the measurement results, is used or an approximate function in which the variance can be obtained from the noise power value, which is determined on the basis of the measurement results, is used. When the table is used, the table is prepared in the channel estimation unit 22 in advance, and when the function is used, an approximate function is equipped in the channel estimation unit 22 in advance. A determination as to whether or not a difference appears in the wireless transmission characteristics is made using, for example, an error rate of the signal bit obtained in the decoding unit 31, an occurrence rate of retransmission between the terminal 10 and the RRH 20, or the like.

The demodulation unit 23 performs soft decision demodulation on the data signal on the basis of the channel information estimated by the channel estimation unit 22 and the demodulation parameter determined by the control signal. The demodulation unit 23 outputs a sequence of the LLR values obtained through the soft decision demodulation to the LLR quantization unit 24.

The LLR quantization unit 24 calculates the statistical distribution of the LLR value on the basis of the average value of the LLR value and the variance of the LLR value. As described above, the average value of the LLR values is determined in accordance with a modulation scheme that is used in communication between the terminal 10 and the RRH 20. The variance of the LLR value is calculated by the channel estimation unit 22. The LLR quantization unit 24 determines a quantization threshold value and a quantization level in quantization for the LLR value on the basis of the statistical distribution of the LLR value. For the determination of the quantization threshold value and the quantization level, a known technology such as the technology of Non-Patent Document 3 is used. The LLR quantization unit 24 quantizes the LLR value output from the demodulation unit 23 on the basis of the determined quantization threshold value and the determined quantization level, and transmits a digital signal obtained through the quantization to the BBU 30.

In the BBU 30, the decoding unit 31 receives the digital signal indicating the quantized LLR value from the LLR quantization unit 24, and performs a decoding process on the received digital signal to obtain a signal bit. The decoding unit 31 outputs the obtained signal bit to the high-level functional unit 32 as information transmitted from the terminal 10.

In the wireless communication system 1 of the first embodiment, the channel estimation unit 22 in the RRH 20 calculates the variance of the LLR value from the power of the noise signal included in the radio signal. The LLR quantization unit 24 calculates the statistical distribution of the LLR value from the average value of the LLR values determined in accordance with the modulation scheme and the variance of the LLR value calculated by the channel estimation unit 22, and further performs quantization based on the statistical distribution. Since it is unnecessary to collect samples of the LLR value in order to obtain the statistical distribution of the LLR value, the LLR quantization unit 24 can start the quantization of the LLR value as soon as the LLR quantization unit 24 acquires the variance of the LLR value from the channel estimation unit 22. The wireless communication system 1 can reduce a processing delay in the LLR quantization by including the channel estimation unit 22 and the LLR quantization unit 24.

Second Embodiment

Figure 3:
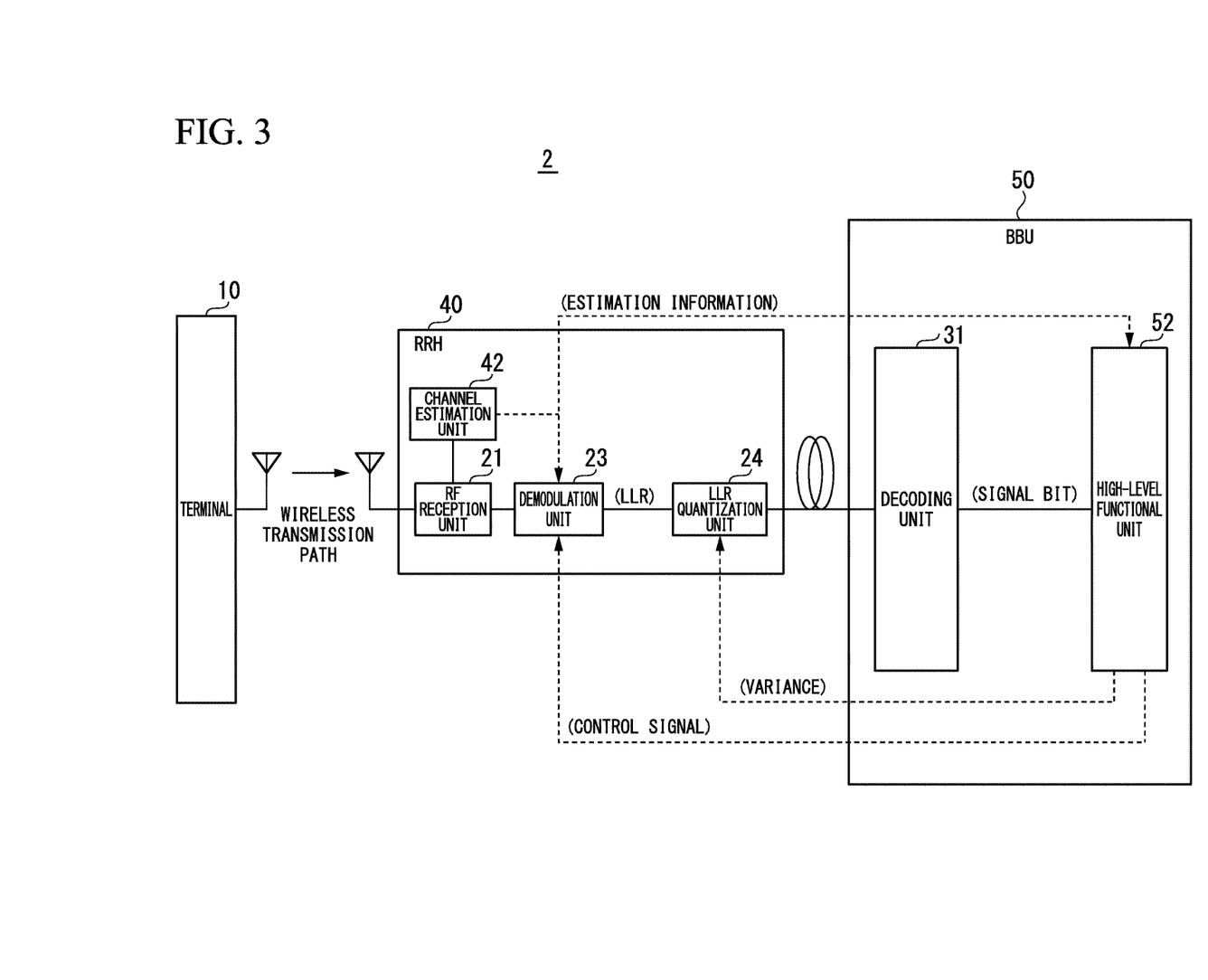
FIG. 3 is a block diagram showing a configuration example of a wireless communication system in a second embodiment.

In a wireless communication system according to a second embodiment, calculation of the variance of the LLR value is calculated in the BBU. FIG. 3 is a block diagram showing a configuration example of the wireless communication system 2 in the second embodiment. The wireless communication system 2 includes a terminal 10 and an RRH 40 and a BBU 50 that function as base stations. The RRH 40 as a wireless device includes an RF reception unit 21, a channel estimation unit 42, a demodulation unit 23, and an LLR quantization unit 24. The BBU 50 as a signal processing device includes a decoding unit 31 and a high-level functional unit 52.

The RRH 40 and the BBU 50 perform predetermined settings before starting a process of receiving a radio signal transmitted from the terminal 10, similarly to the RRH 20 and the BBU 30 of the wireless communication system 1 in the first embodiment.

The channel estimation unit 42 in the RRH 40 compares a predetermined signal between the terminal 10 and the RRH 40 with a reference signal output from the RF reception unit 21 and estimates channel information indicating the amount of phase rotation and the amount of attenuation from which the radio signal suffers in the wireless transmission path, similarly to the channel estimation unit 22. The channel estimation unit 42 transmits estimation information including the estimated channel information and the reference signal to the BBU 50. The channel estimation unit 42 outputs the estimated channel information to the demodulation unit 23.

In the BBU 50, the high-level functional unit 52 calculates the variance of the LLR value on the basis of the estimation information received from the channel estimation unit 42 of the RRH 40. The high-level functional unit 52 extracts a noise signal included in the reference signal and calculates the variance of the LLR value from the power of the extracted noise signal, similarly to the channel estimation unit 22 in the first embodiment. The high-level functional unit 52 transmits the calculated variance of the LLR value to the LLR quantization unit 24 of the RRH 40.

The LLR quantization unit 24 in the second embodiment calculates a statistical distribution of the LLR value using the variance of the LLR value received from the high-level functional unit 52 of the BBU 50 instead of the variance of the LLR value output from the channel estimation unit 22.

In the wireless communication system 2 according to the second embodiment, it is possible to reduce a calculation load on the RRH 40 by calculating the variance of the LLR value in the BBU 50. Further, in the wireless communication system 2, since it is unnecessary to collect samples of the LLR value in order to obtain the statistical distribution of the LLR value, the LLR quantization unit 24 can start the quantization of the LLR value as soon as the LLR quantization unit 24 acquires the variance of the LLR value from the BBU 50. The wireless communication system 2 can reduce a processing delay in the LLR quantization by including the channel estimation unit 42, the high-level functional unit 52 and the LLR quantization unit 24.

First Modification Example

Figure 4:
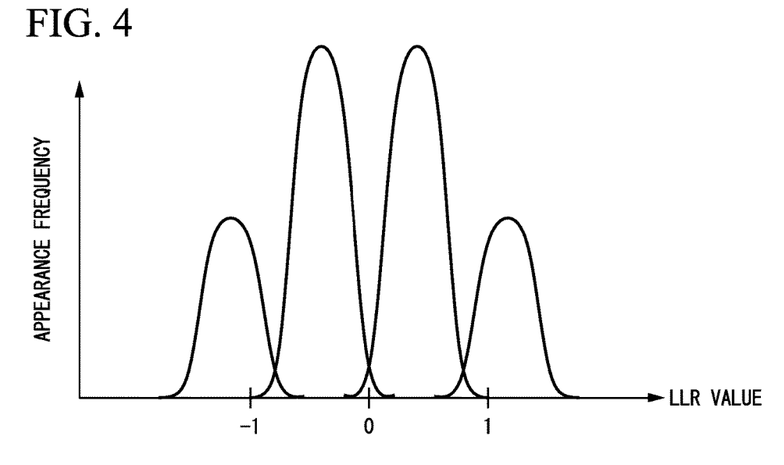
FIG. 4 is a diagram showing an example of a statistical distribution of the LLR value obtained from a signal modulated using 16 QAM that is a multi-level modulation scheme.

In the wireless communication system 1 according to the first embodiment, a modulation scheme for multi-level modulation such as 16 QAM or 64 QAM can be used in addition to BPSK as a modulation scheme that is used for wireless communication between the terminal 10 and the RRH 20. FIG. 4 is a diagram showing an example of a statistical distribution of the LLR value that is obtained from a signal modulated using 16 QAM which is a multi-level modulation scheme. In FIG. 4, a horizontal axis indicates the LLR value and a vertical axis indicates an appearance frequency of the LLR value. As shown in FIG. 4, since the number of signal points (symbols) increases as compared with the BPSK shown in FIG. 1, the statistical distribution of the LLR value in the case that 16 QAM is used as the modulation scheme includes four Gaussian distributions symmetrical to a straight line with the LLR value=0. Even in the case that a multi-level modulation scheme is used, a proportion and an average value of the respective Gaussian distributions are determined in advance on the basis of the modulation scheme, as in the case that the binary modulation scheme is used.

The channel estimation unit 22 extracts the noise signal included in the reference signal on the basis of the estimated channel information, the reference signal and the predetermined signal, and calculates the variance of the LLR value from the power of the noise signal. The LLR quantization unit 24 calculates the Gaussian distribution of each signal point on the basis of the variance of the LLR value calculated by the channel estimation unit 22 and the proportion and the average value of the respective Gaussian distributions determined in advance in accordance with the modulation scheme, and performs quantization of the LLR value using the calculated Gaussian distributions as the statistical distribution.

In the first embodiment, even when the multi-level modulation scheme is used for wireless communication between the terminal 10 and the RRH 20, similarly, since it is unnecessary to collect samples of the LLR value in order to obtain the statistical distribution of the LLR value, the LLR quantization unit 24 can start the quantization of the LLR value as soon as the LLR quantization unit 24 acquires the variance of the LLR value from the channel estimation unit 22, and can reduce a processing delay in the LLR quantization.

Second Modification Example

In the wireless communication system 2 according to the second embodiment, the multi-level modulation scheme such as 16 QAM or 64 QAM can also be used, as in the first embodiment. In the case that a multi-level modulation system is applied in the wireless communication system 2, the high-level functional unit 52 extracts the noise signal included in the reference signal on the basis of the channel information and the reference signal included in the estimation information received from the channel estimation unit 22 and the predetermined signal, and calculates the variance of the LLR value from the power of the noise signal. The LLR quantization unit 24 calculates a Gaussian distribution of each signal point on the basis of the variance of the LLR value calculated by the high-level functional unit 52 and the predetermined proportion and the predetermined average value of the respective Gaussian distributions, and performs quantization of the LLR value using the calculated Gaussian distributions as the statistical distributions.

In the second embodiment, even when the multi-level modulation scheme is used for wireless communication between the terminal 10 and the RRH 40, similarly, since it is unnecessary to collect samples of the LLR value in order to obtain the statistical distribution of the LLR value, the LLR quantization unit 24 can start the quantization of the LLR value as soon as the LLR quantization unit 24 acquires the variance of the LLR value from the BBU 50, and can reduce a processing delay in the LLR quantization.

Third Modification Example

Although the configuration example in which one RRH is connected to one BBU and communicates with it has been shown in the first and second embodiment, a plurality of RRHs may be connected to one BBU and communicate with it.

According to the wireless communication system in each of the embodiments described above, since it is possible to calculate the statistical distribution of the LLR value without collecting the samples of the LLR value and perform the LLR quantization, it is possible to reduce the processing delay in the LLR quantization.

It should be noted that although the case in which the wireless communication system has a configuration in which functions of the base station that performs wireless communication with the terminal are divided for the BBU and the RRH has been described in each of the embodiments described above, respective functional units included in the BBU and the RRH may be included in one device or may be distributed and included in three or more devices.

Although the embodiments of the present invention have been described above in detail with reference to the drawings, the specific configuration is not limited to the embodiments, and designs or the like within the scope not deviating from the gist of the present invention are also included.

INDUSTRIAL APPLICABILITY

The present invention is also applicable to applications in which it is indispensable to reduce a processing delay caused by LLR quantization.

REFERENCE SIGNS LIST 1, 2: Wireless communication system
10, 91: Terminal
20, 40, 92: RRH
21, 921: RF reception unit
22, 42, 922: Channel estimation unit
23, 923: Demodulation unit
24, 924: LLR quantization unit
30, 50, 93: BBU
31, 931: Decoding unit
32, 52, 932: High-level functional unit

The invention claimed is:

1. A wireless communication system comprising:
a radio frequency (RF) receiver configured to receive a radio signal from a terminal;
a channel estimator configured to estimate channel information of a wireless transmission path with respect to the terminal on a basis of the radio signal received by the RF receiver;
a demodulator configured to perform soft decision demodulation on the radio signal on a basis of the channel information estimated by the channel estimator;
a quantizer configured to quantize a log likelihood ratio obtained through soft decision demodulation in the demodulator, on a basis of a statistical distribution determined using an average value of the log likelihood ratio determined in accordance with a modulation scheme used in wireless communication with the terminal and a variance of a log likelihood ratio obtained on a basis of the channel information; and
a decoder configured to perform a decoding process on the log likelihood ratio quantized by the quantizer.

2. The wireless communication system according to claim 1, wherein
the channel estimator is further configured to calculate the variance of the log likelihood ratio on a basis of the channel information, and output the calculated variance to the quantizer.

3. The wireless communication system according to claim 1, further comprising
a high-level functional processor configured to calculate the variance of the log likelihood ratio on a basis of the channel information estimated by the channel estimator and transmits its the variance to the quantizer.

4. The wireless communication system according to claim 1, wherein
the quantizer is further configured to determine a quantization threshold value and a quantization level on a basis of a Gaussian distribution having the variance and the average value of the log likelihood ratio determined in accordance with the modulation scheme used in the wireless communication with the terminal.

5. A communication method comprising:
a radio frequency (RF) reception step of receiving a radio signal from a terminal;
a channel estimation step of estimating channel information of a wireless transmission path with respect to the terminal on a basis of the radio signal received in the RF reception step;
a demodulation step of performing soft decision demodulation on the radio signal on a basis of the channel information estimated in the channel estimation step;
a quantization step of quantizing a log likelihood ratio obtained in the demodulation step, on a basis of a statistical distribution determined using an average value of the log likelihood ratio determined in accordance with a modulation scheme used in wireless communication with the terminal and a variance of a log likelihood ratio obtained on a basis of the channel information; and
a decoding step of performing a decoding process on the log likelihood ratio quantized in the quantization step.

* * * * *